United States Patent
Chung

(10) Patent No.: US 6,328,612 B1
(45) Date of Patent: *Dec. 11, 2001

(54) STACKED HOUSINGS FOR NETWORK DEVICES

(75) Inventor: Ming-Tsai Chung, Hsinchu (TW)

(73) Assignee: D-Link Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/615,800

(22) Filed: Jul. 13, 2000

(51) Int. Cl.⁷ .................................................. H01R 9/22
(52) U.S. Cl. ........................... 439/717; 439/928; 361/732
(58) Field of Search ................................. 439/709, 717, 439/718, 928; 361/732, 735

(56) References Cited

U.S. PATENT DOCUMENTS 6,085,925 * 7/2000 Chung .................................. 220/4.02
6,137,686 * 10/2000 Saye ..................................... 361/732

* cited by examiner

Primary Examiner—Khiem Nguyen
(74) Attorney, Agent, or Firm—Bacon & Thomas, PLLC

(57) ABSTRACT

Stacked housings for network devices are disclosed. Each housing comprises a raised member formed on the a side, raised member spaced from either side of housing, an engagement member formed at the joining of raised member and housing, a plurality of grooves formed on the top of raised member, two opposed legs provided in a side opposed to raised member, a matching engagement member formed at the edge of leg, and a rib provided between legs wherein raised member of one housing is sandwiched between legs of the other, engagement members of one housing are engaged with the matching engagement members of the other, and rib of one housing engages with one of grooves of the other. By utilizing this, two or more housings can be stably stacked.

7 Claims, 3 Drawing Sheets

STACKED HOUSINGS FOR NETWORK DEVICES

FIELD OF THE INVENTION

The present invention relates to housings and more particularly to stacked housings for network devices.

BACKGROUND OF THE INVENTION

Conventionally, a variety of network products, for example hub, switch, modem, printer server, gateway, and integrated service digital network (ISDN) each has a predetermined shape. As such, a considerable space is required if two or more of above network products are used. Further, such stacked network products may be messy because each network product has a predetermined shape. This is inconvenient for management and detection.

Thus, it is desirable to provide stacked housings for network devices wherein each housing is matched to the other such that the stacked housings are in good order as well as capable of carrying out a convenient management and detection.

SUMMARY OF THE INVENTION

It is an object of the present invention to provide stacked housings for network devices wherein raised member of one housing is sandwiched between legs of the other housing, engagement members of one housing are engaged with the matching engagement members of the other housing such that two sides of housings have the functionalities of alignment and engagement, and rib of one housing engages with one of grooves of the other housing such that the front and rear sides of housings have the functionality of positioning. By utilizing this, two or more housings are stably stacked, thereby enabling to carry out a convenient management and detection.

The above and other objects, features and advantages of the present invention will become apparent from the following detailed description taken with the accompanying drawings.

DETAILED DESCRIPTION OF THE PREFERRED EMBODIMENTS

Figure 1:
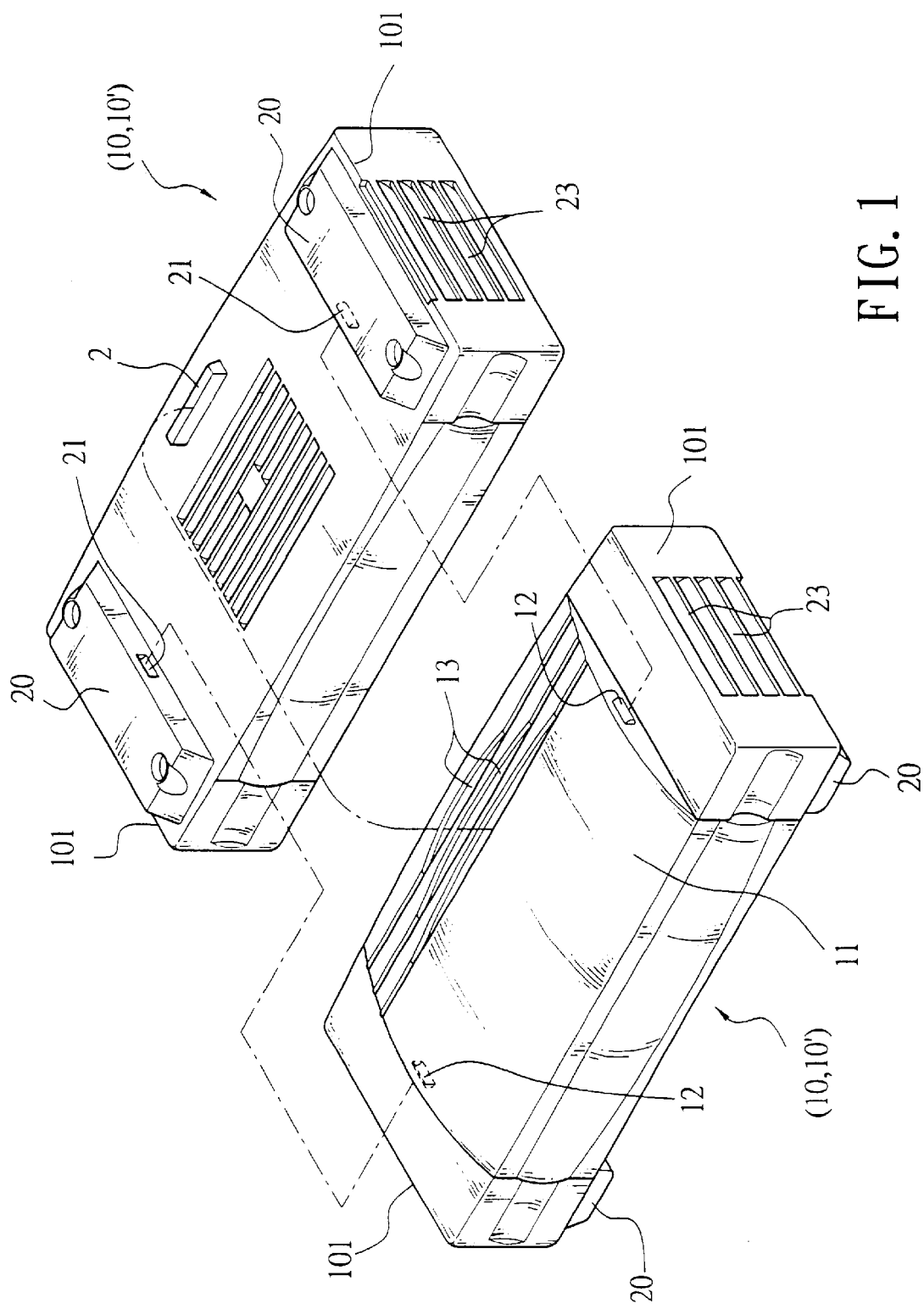
FIG. 1 is an exploded view of a preferred embodiment of stacked housings for network devices according to the invention.
Figure 2:
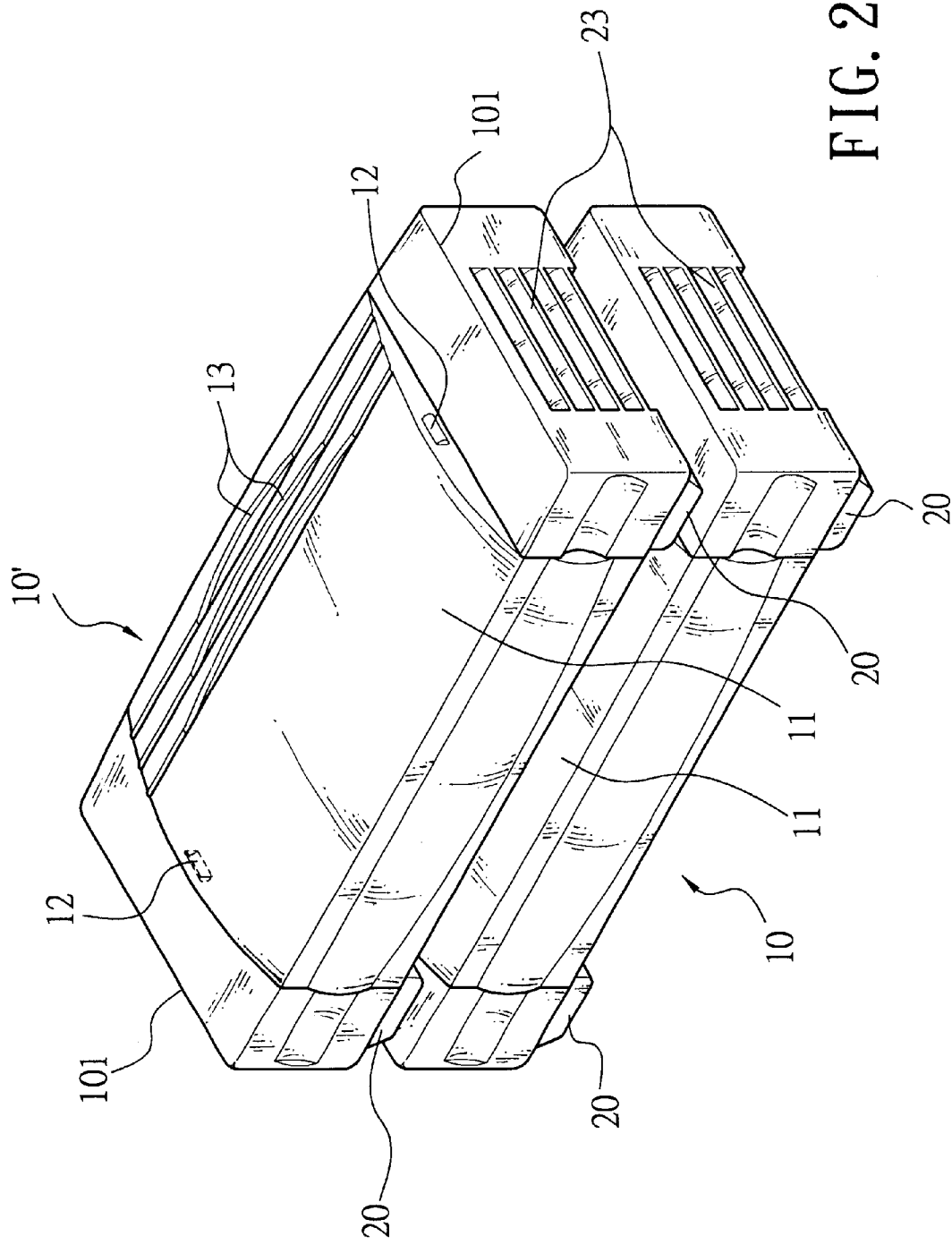
FIG. 2 is a side view in part section of two stacked housings of FIG. 1.
Figure 3:
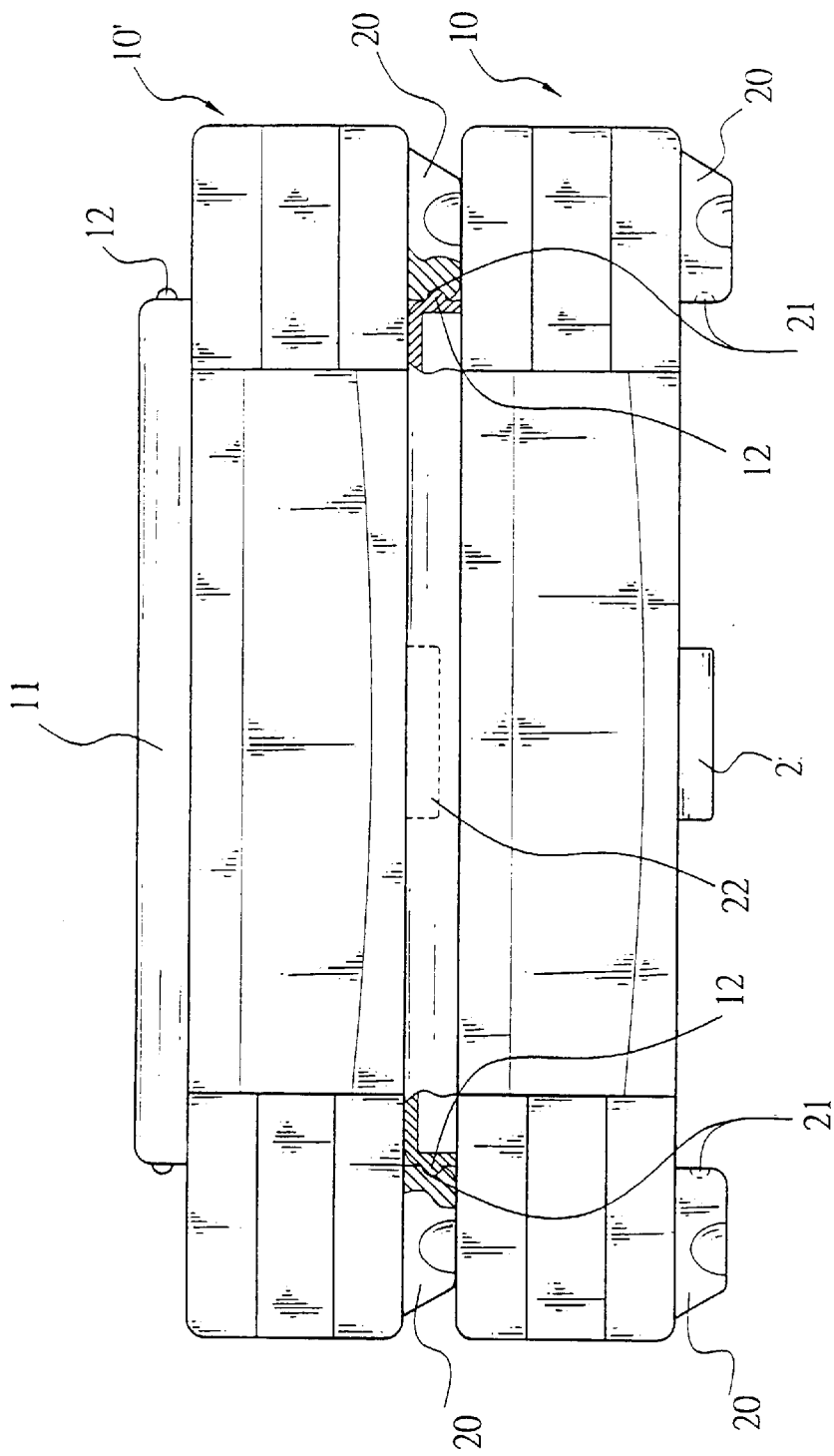
FIG. 3 is a perspective view of FIG. 2.

Referring to FIGS. 1, 2, and 3, there is shown two stacked housings 10 and 10' constructed in accordance with the invention. Housing 10 is a generally parallelpiped member having electronics of a specific network product (not shown) mounted therein. A raised member 11 is formed on the a side (e.g., top side in this embodiment) of housing 10. Raised member 11 is spaced from either side 101 by a predetermined distance. The front and rear edges of the smooth raised member 11 are defined by the front and rear edges of housing 10. An engagement member (e.g., tab) 12 is formed at either side of raised member 11, i.e., at the joining of raised member 11 and housing 10. A plurality of grooves 13 are formed on the top of raised member 11 (FIG. 1).

Two opposed legs 20 are provided in the side of housing 10 opposed to raised member 11 (i.e., bottom) (see FIG. 1). One side of leg 20 is abutted to the joining edge of raised member 11 and housing 10 when housings 10 and 10' are stacked. A matching engagement member 21 (e.g., slot) is formed at the inner edge of leg 20, i.e., on the joining edge of leg 20 and the bottom of housing 10. Engagement members 21 of one housing 10 are engaged with the matching engagement members 21 of the other housing 10' which is stacked on housing 10 (see FIGS. 1 and 2). A rib 2 is provided between legs 20 as shown in FIGS. 1 and 2). As such, rib 2 may engage with one of grooves 13 when raised member 11 of one housing 10' stacked below the other housing 10 are sandwiched between legs 20 of the other housing 10.

A plurality of ventilation openings 23 are provided on either side of housing 10, i.e., at side 101 adjacent leg 20. Ventilation openings 23 serve to ventilate heat generated by electronics in housing 10.

With above construction, one housing 10' may be stacked on the other housing 10. That is, raised member 11 of the other housing 10 is sandwiched between legs 20 of one housing 10'. Engagement members 21 of one housing 10' are engaged with the matching engagement members 21 of the other housing 10. As such, two sides of housings 10 and 10' have the functionalities of alignment and engagement. Also, rib 2 of one housing 10' may engage with one of grooves 13 of the other housing 10. As such, the front and rear sides of housings 10 and 10' have the functionality of positioning (FIGS. 2 and 3). As a result, two or more housings 10 are stably stacked, thereby enabling to carry out a convenient management and detection.

While the invention herein disclosed has been described by means of specific embodiments, numerous modifications and variations could be made thereto by those skilled in the art without departing from the scope and spirit of the invention set forth in the claims.

What is claimed is:

1. A housing for a network device comprising:

a raised member formed on the top of the housing, the raised member spaced from either side of the housing by a predetermined distance;

two engagement members each formed at the joining of the raised member and the housing;

two legs each provided in the bottom of the housing; and two matching engagement members each formed at the joinging of the leg and the bottom of the housing;

wherein the engagement members of one housing are secured to the matching engagement members of the other housing.

2. The housing of claim 1, wherein the engagement member is a tab.

3. The housing of claim 1, wherein the matching engagement member is a slot.

4. The housing of claim 1, further comprising a plurality of grooves formed on the top of the raised member and a rib provided between the legs.

5. The housing of claim 4, wherein the rib of one housing is secured to one of the grooves of the other housing when the raised member of one housing is sandwiched between the legs of the other housing.

6. The housing of claim 1, further comprising a plurality of ventilation openings provided on either side of the housing adjacent to the leg for ventilating heat generated by electronics in the housing.

7. The housing of claim 1, wherein the front and rear edges of the raised member are defined by the front and rear edges of the housing.

* * * * *